United States Patent
Tews et al.

(10) Patent No.: US 8,946,034 B2
(45) Date of Patent: Feb. 3, 2015

(54) STRAINED SEMICONDUCTOR DEVICE AND METHOD OF MAKING THE SAME

(71) Applicant: Infineon Technologies AG, Neubiberg (DE)

(72) Inventors: Helmut Horst Tews, Poughkeepsie, NY (US); Andre Schenk, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/087,918

(22) Filed: Nov. 22, 2013

(65) Prior Publication Data

US 2014/0077299 A1   Mar. 20, 2014

Related U.S. Application Data

(62) Division of application No. 13/193,692, filed on Jul. 29, 2011, now Pat. No. 8,624,334, which is a division of application No. 11/224,825, filed on Sep. 13, 2005, now Pat. No. 8,003,470.

(51) Int. Cl.
*H01L 21/336* (2006.01)
*H01L 27/12* (2006.01)
(Continued)

(52) U.S. Cl.
CPC ........ *H01L 27/1203* (2013.01); *H01L 29/6653* (2013.01); *H01L 29/66636* (2013.01);
(Continued)

(58) Field of Classification Search
USPC .................................. 438/300; 257/E21.431
See application file for complete search history.

(56) References Cited

U.S. PATENT DOCUMENTS 5,364,497 A   11/1994   Chau et al.
5,679,610 A   10/1997   Matsuda et al.
(Continued)

FOREIGN PATENT DOCUMENTS

JP   03272182 A   12/1991
JP   04079337     3/1992
(Continued)

OTHER PUBLICATIONS

Dunga, M. V., et al., "A Holistic Model for Mobility Enhancement through Process-Induced Stress," IEEE Conference on Electron Devices and Solid-State Circuits, Dec. 19-21, 2005, pp. 43-46.
(Continued)

*Primary Examiner* — Daniel Luke
(74) *Attorney, Agent, or Firm* — Slater & Matsil, L.L.P.

(57) ABSTRACT

In a method for forming a semiconductor device, a gate electrode is formed over a semiconductor body (e.g., bulk silicon substrate or SOI layer). The gate electrode is electrically insulated from the semiconductor body. A first sidewall spacer is formed along a sidewall of the gate electrode. A sacrificial sidewall spacer is formed adjacent the first sidewall spacer. The sacrificial sidewall spacer and the first sidewall spacer overlying the semiconductor body. A planarization layer is formed over the semiconductor body such that a portion of the planarization layer is adjacent the sacrificial sidewall spacer. The sacrificial sidewall spacer can then be removed and a recess etched in the semiconductor body. The recess is substantially aligned between the first sidewall spacer and the portion of the planarization layer. A semiconductor material (e.g., SiGe or SiC) can then be formed in the recess.

17 Claims, 7 Drawing Sheets

(51) Int. Cl.
  *H01L 29/66*       (2006.01)
  *H01L 29/78*       (2006.01)
  *H01L 21/8238*     (2006.01)

(52) U.S. Cl.
  CPC ........ *H01L29/7834* (2013.01); *H01L 29/7848* (2013.01); *H01L 21/823807* (2013.01); *H01L 21/823814* (2013.01); *H01L 21/823864* (2013.01); *H01L 29/66477* (2013.01)
  USPC .................................. 438/300; 257/E21.431

(56) References Cited

U.S. PATENT DOCUMENTS

| | | | |
|---|---|---|---|
| 6,111,267 | A | 8/2000 | Fischer et al. |
| 6,136,679 | A | 10/2000 | Yu et al. |
| 6,294,817 | B1 | 9/2001 | Srinivasan et al. |
| 6,403,482 | B1 | 6/2002 | Rovedo et al. |
| 6,417,056 | B1 | 7/2002 | Quek et al. |
| 6,448,180 | B2 | 9/2002 | Mani et al. |
| 6,495,437 | B1 | 12/2002 | Yu |
| 6,583,000 | B1 | 6/2003 | Hsu et al. |
| 6,621,131 | B2 | 9/2003 | Murthy et al. |
| 6,679,610 | B2 | 1/2004 | Yamauchi |
| 6,703,648 | B1 | 3/2004 | Xiang et al. |
| 6,787,464 | B1 | 9/2004 | Cheek et al. |
| 6,825,086 | B2 | 11/2004 | Lee et al. |
| 6,927,138 | B2 | 8/2005 | Takenaka |
| 7,023,059 | B1 | 4/2006 | Chan et al. |
| 7,135,724 | B2 | 11/2006 | Chen et al. |
| 7,279,367 | B1 | 10/2007 | Horch et al. |
| 2002/0135015 | A1 | 9/2002 | Chen et al. |
| 2003/0040151 | A1 | 2/2003 | Lee |
| 2003/0080361 | A1 | 5/2003 | Murthy et al. |
| 2003/0140844 | A1 | 7/2003 | Maa et al. |
| 2003/0234422 | A1 | 12/2003 | Wang et al. |
| 2004/0007724 | A1 | 1/2004 | Murthy et al. |
| 2004/0021179 | A1 | 2/2004 | Lee et al. |
| 2004/0026765 | A1 | 2/2004 | Currie et al. |
| 2004/0087107 | A1 | 5/2004 | Takenaka |
| 2004/0126705 | A1 | 7/2004 | Lu et al. |
| 2004/0142537 | A1 | 7/2004 | Lee et al. |
| 2004/0173815 | A1 | 9/2004 | Yeo et al. |
| 2004/0212019 | A1 | 10/2004 | Shinohara et al. |
| 2004/0264270 | A1 | 12/2004 | Iwata et al. |
| 2005/0029601 | A1 | 2/2005 | Chen et al. |
| 2005/0035369 | A1 | 2/2005 | Lin et al. |
| 2005/0035470 | A1 | 2/2005 | Ko et al. |
| 2005/0048753 | A1 | 3/2005 | Schwan |
| 2005/0093075 | A1 | 5/2005 | Bentum et al. |
| 2005/0093084 | A1 | 5/2005 | Wang et al. |
| 2005/0101077 | A1 | 5/2005 | Lee et al. |
| 2005/0106821 | A1 | 5/2005 | Snyder et al. |
| 2005/0142878 | A1 | 6/2005 | Jung |
| 2005/0184345 | A1 | 8/2005 | Lin et al. |
| 2005/0194699 | A1 | 9/2005 | Belyansky et al. |
| 2005/0260807 | A1 | 11/2005 | Orlowski et al. |
| 2005/0272187 | A1 | 12/2005 | Murthy et al. |
| 2006/0009001 | A1 * | 1/2006 | Huang et al. .................. 438/305 |
| 2006/0081896 | A1 | 4/2006 | Maeda |
| 2006/0088968 | A1 * | 4/2006 | Shin et al. ..................... 438/299 |

FOREIGN PATENT DOCUMENTS

| | | |
|---|---|---|
| JP | 2003229361 | 8/2003 |
| JP | 2003234453 | 8/2003 |
| JP | 2004153173 | 5/2004 |
| JP | 2004311954 | 11/2004 |
| JP | 2006121074 | 5/2006 |
| JP | 2008504677 | 2/2008 |
| WO | 0143197 A2 | 6/2001 |
| WO | 2004008489 A2 | 1/2004 |
| WO | 2006006972 A1 | 1/2006 |

OTHER PUBLICATIONS

Moroz, V., et al., "Analyzing strained-silicon options for stress-engineering transistors," Solid State Technology, Jul. 2004, 3 pages, Penn Well Corporation.

* cited by examiner

US 8,946,034 B2

STRAINED SEMICONDUCTOR DEVICE AND METHOD OF MAKING THE SAME

This is a divisional application of U.S. patent application Ser. No. 13/193,692, entitled "Strained Semiconductor Device and Method of Making the Same," which was filed on Jul. 29, 2011 which is a divisional application of U.S. patent application Ser. No. 11/224,825, issued on Aug. 23, 2011 as U.S. Pat. No. 8,003,470, entitled "Strained Semiconductor Device and Method of Making the Same," which was filed on Sep. 13, 2005, both of which are incorporated herein by reference.

TECHNICAL FIELD

This invention relates generally semiconductor devices and methods, and more particularly to a strained semiconductor device and a method of making the same.

BACKGROUND

Semiconductor devices are used in a large number of electronic devices such as computers, cell phones and others. One of the goals of the semiconductor industry is to continue shrinking the size and increasing the speed of individual devices. Smaller devices can operate at higher speeds since the physical distance between components is smaller. In addition, higher conductivity materials such as copper are replacing lower conductivity materials such as aluminum. One other challenge is to increase the mobility of semiconductor carriers such as electrons and holes.

One technique to improve transistor performance is to mechanically strain (i.e., distort) the semiconductor crystal lattice near the charge-carrier channel region. Transistors built on strained silicon, for example, have greater charge-carrier mobility than those fabricated using conventional substrates. One way to create strain is to provide a stress layer over the transistor. Variants of stress layers can be used for mobility and performance boost of devices. For example, stress can be provided by a contact etch stop layer (CESL), single layers, dual layers, stress memory transfer layers, and STI liners. Most of these techniques use nitride layers to provide tensile or compressive stresses; however, other materials can be used in other applications, e.g., HDP oxide layers.

Another technique to strain silicon is to provide a layer of germanium or silicon germanium. A thin layer of silicon may be grown over the germanium-containing layer. Since the germanium crystal lattice constant is larger than the silicon lattice constant, the germanium-containing layer creates a lattice mismatch stress in adjacent layers. Due to the different lattice structures, the SiGe will impart a strain onto the silicon layer. This strained silicon layer can be utilized to fabricate faster transistors.

One example of making a strained-silicon CMOS device with a shallow trench isolation (STI) oxide region is disclosed in U.S. Patent Application Publication No. 2005/0101077, which is incorporated herein by reference. In this method, a silicon substrate is formed and a relaxed-SiGe layer is formed over the silicon substrate or a SiGe-on-insulator substrate with a buried oxide (BOX) layer. A strained-Si layer overlies the relaxed-SiGe layer. A silicon oxide layer is formed over the strained-Si layer and a silicon nitride hardmask layer is formed over the silicon oxide layer. The silicon nitride layer, the silicon oxide layer, the strained-Si layer, and the relaxed-SiGe layer are etched to form an STI trench. A sacrificial oxide liner is formed on the STI trench surface to round and reduce stress at the STI trench corners. The sacrificial oxide liner is then removed and the STI trench is filled with silicon oxide.

As another example, U.S. Patent Application Publication No. 2004/0173815, which is incorporated herein by reference, discloses a method of fabricating a strained-channel transistor structure. A substrate includes a first semiconductor material with a first natural lattice constant, a gate dielectric layer on the substrate, a gate electrode on the gate dielectric layer, a source region and drain region oppositely adjacent to the gate dielectric layer, and a spacer on a sidewall of the gate electrode. One or both of the source region and drain region are recessed to form a recess. The recess can then be filled with a second semiconductor material with a second natural lattice constant different from the first natural lattice constant as a lattice-mismatched zone.

SUMMARY OF THE INVENTION

In the prior art, as described above, trenches are etched next to transistor gates. These trenches are filled with epitaxial SiGe or other material that has a different lattice constant than silicon. Due to the different lattice constants or thermal expansion coefficients, mechanical stress is produced and issued onto the transistor channel, resulting in improved carrier mobilities and thus improved transistor performance.

In one aspect, the present invention expands upon these concepts by etching trenches of identical lengths at well defined positions in the vicinity of a transistor gate. In the prior art, trenches are etched with different lengths caused by the non-constant pattern density in different areas of a circuit. Trenches of different lengths or depths cause different mechanical stress. Therefore, an equal impact of the mechanical stress on the transistor performance is not guaranteed for all transistors. This results in different transistor parameters depending upon the position and environment of a transistor in a circuit, as well as on the distance to neighboring transistor gates.

In one aspect, the present invention provides a self-aligned etching and filling of grooves or recesses in silicon (or another semiconductor) in the neighborhood of a gate. The preferred method assures a uniform length of the trenches resulting in a uniform filling with equivalent amounts of material. One advantage is that the trenches can be designed uniformly over the wafer surface. This allows for good stress optimization.

For example, in one embodiment method, a gate electrode is formed over a semiconductor body (e.g., bulk silicon substrate or SOI layer). The gate electrode is electrically insulated from the semiconductor body. A first sidewall spacer is formed along a sidewall of the gate electrode. A sacrificial sidewall spacer is formed adjacent the first sidewall spacer. A planarization layer is formed over the semiconductor body such that a portion of the planarization layer is adjacent the sacrificial sidewall spacer. The sacrificial sidewall spacer can then be removed and a recess etched in the semiconductor body. The recess is substantially aligned between the first sidewall spacer and the portion of the planarization layer. A semiconductor material (e.g., SiGe or SiC) can then be formed in the recess.

Processes of the present invention can lead to a number of embodiment structures. In a first embodiment, a transistor includes an isolation region (e.g., STI) and a gate electrode disposed over an upper surface of the semiconductor body. A sidewall spacer is disposed along a sidewall of the gate electrode. A region of a second semiconductor material is embedded within the semiconductor body. The region of second semiconductor material is located adjacent the sidewall spacer.

In another embodiment, a first gate electrode is disposed over an upper surface of the semiconductor body and a first sidewall spacer is disposed along a sidewall of the first gate electrode. A second gate electrode is also disposed over an upper surface of the semiconductor body and a second sidewall spacer is disposed along a sidewall of the second gate electrode. A first region of a second semiconductor material embedded within the semiconductor body adjacent the first sidewall spacer and a second region of the second semiconductor material embedded within the semiconductor body adjacent the second sidewall spacer. The second region is laterally spaced from the first region without any intervening isolation material.

The details of one or more embodiments of the invention are set forth in the accompanying drawings and the description below. Other features and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a transistor device with a strained channel. The invention may also be applied, however, to other structures that require strained or stressed semiconductor regions or other structures that require one material to be embedded in a region of another material.

Figure 1:
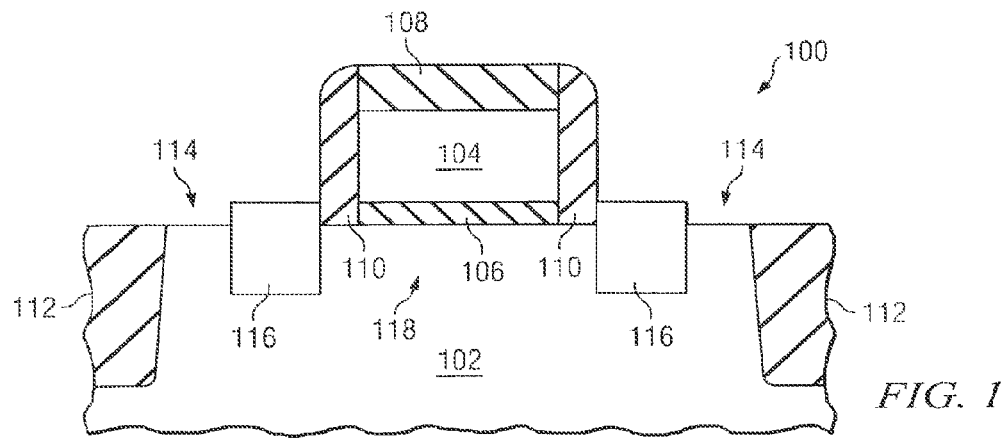
FIG. 1 is a cross-sectional view of a first embodiment transistor structure.

FIG. 1, illustrates a first embodiment structure 100 of the present invention that is formed in a semiconductor body 102. The semiconductor body 102 can be a bulk semiconductor substrate, a region (e.g., well or tub) within a substrate, or a semiconductor layer over a substrate. For example, the present invention works well with semiconductor-on-insulator (SOI) technology. In the preferred embodiment, the semiconductor body is made of silicon. In other embodiments, other materials can be used.

The structure 100 is formed in an active region of the semiconductor body 102. The active region is delineated from other active regions by isolation region 112. In the preferred embodiment, isolation region 112 is a trench isolation (e.g., shallow trench isolation or STI) region that surrounds the active area. The STI region 112 can be formed, for example, by forming a trench that is filled with a dielectric such as silicon oxide or a silicon nitride. One purpose of the isolation region 112 is to electrically isolate structures 100 in the active region from surrounding structures. In other embodiments, the isolation could be created by deep trench isolation, mesa isolation, or field isolation, as but three examples.

In the illustrated example, the active region contains a transistor 100. Transistor 100 includes a gate electrode 104 that is disposed over an upper surface of the semiconductor body 102. The gate electrode 104 can be formed from one or more conductors such as polysilicon or a metal, or a combination of both. In one embodiment, the gate electrode 104 includes a silicide (e.g., nickel silicide, tungsten silicide, titanium silicide) overlying a polysilicon region. The metal gate can be a metal (e.g., Ir, Ru, RuTa, Ti, Mo), metal silicide (e.g., a fully silicided gate), metal nitride (e.g., HfN, TiN, TaSiN) or other.

The gate electrode 104 is electrically insulated from a channel region 118 by a gate dielectric 106. The gate dielectric can be an oxide, a nitride or a combination of oxide and nitride (e.g., silicon oxynitride (SiON) or an oxide-nitride-oxide (ONO) stack), for example. In other embodiments, the gate dielectric 106 can be a high-k dielectric (i.e., a dielectric with a dielectric constant greater than the dielectric constant of $Si_3N_4$). Examples of high-k dielectrics that can be used as a gate dielectric include $HfO_2$, (nitrided) Hf silicate, $Al_2O_3$, $ZrO_2$, Zr—Al—O, and Zr silicate.

A hard mask layer 108 overlies the gate electrode 104. The hard mask layer 108 is typically formed from an insulating material, such as silicon nitride. This layer is typically formed as part of the fabrication process of the gate electrode and can be eliminated if desired.

A sidewall spacer 110 is disposed along a sidewall of the gate electrode 104 and, in this example, hard mask layer 108. In one embodiment, the sidewall spacer 110 includes multiple layers such as a nitride and an oxide. In other embodiments, the sidewall spacer 110 can be a single oxide region or a single nitride region. In yet other embodiments, other materials can be used.

The transistor 100 also includes source/drain regions 114. During operation, current will flow between the source/drain regions 114 depending upon a voltage applied to the gate electrode 104. The present invention applies equally to n-channel transistors (e.g., where the source/drain regions 114 are doped with n-type impurities and the channel 118 is doped with p-type impurities) and p-channel transistors (e.g., where the source/drain regions 114 are doped with p-type impurities and the channel 118 is doped with n-type impurities). The invention also applies to both depletion mode and enhancement mode transistors. A silicide region (not shown) can be included over the source/drain regions 114.

In preferred embodiments of the invention, the source/drain regions 114 each further include a region of a second semiconductor material 116 embedded within the semiconductor body 102. Advantageously, the semiconductor material 116 is a different material than the material of semiconductor body 102. For example, by using a material with a different lattice constant a strained channel 118 can be formed. This strained channel will enhance the mobility of carriers during operation thus creating a faster transistor.

In a first embodiment, the semiconductor body 102 is made from silicon and the second semiconductor material 116 is silicon germanium (SiGe). Silicon germanium has a larger natural lattice constant than silicon and will therefore create a compressive channel stress. This situation is ideal for p-channel transistors. In another embodiment, the second semiconductor material is silicon carbon (SiC), which has a natural lattice constant that is smaller than that of silicon. In that case, a tensile channel stress will be created, which speeds up the electron carriers in an n-channel transistor.

In one embodiment, the n-channel transistor and the p-channel transistor of a CMOS implementation are formed using different materials. As a first example, the different conductivity-type transistors can each include an embedded region 116 with a different material (e.g., SiGe for the p-channel and SiC for the n-channel). In another example, transistors of one type (e.g., p-channel) can include an embedded region 116 (e.g., silicon germanium) while the transistors of the other type (e.g., n-channel) include no embedded region 116 at all (i.e., the source/drain regions are only silicon). In yet another example, all transistors (both n-channel and p-channel) are identical.

In the illustrated embodiment, the embedded semiconductor material 116 extends above the upper surface of the semiconductor body 102. This feature is not required. The semiconductor material 116 can be substantially planar with the semiconductor body 102 or could be recessed below the upper surface of the semiconductor body 102. In one embodiment, which is not illustrated, the embedded material 116 is recessed below the upper surface and covered with a layer of silicon, which can be planar with the remaining silicon body.

Advantageously, the embedded material 116 extends from the gate stack 104 by a distance that is independent of the length of the source/drain 114. It has been discovered that the length of the embedded material 116 influences the amount of strain placed on channel 118. When the length is constant, the strain can be more easily controlled even when the spacing between transistors is not constant. In other words, the stress variations between dense and isolated transistors will be small. As a result, in this preferred embodiment, the region of second semiconductor material 116 is adjacent the sidewall spacer 110 but laterally spaced from the isolation region 112. Since the length of the embedded material region 116 is constant, the amount by which the material 116 is laterally spaced from the isolation region 112 will be a function of the distance between the isolation region 112 and the gate electrode 104 (or sidewall spacer 110).

A first embodiment process to fabricate the transistor of FIG. 1 will be described with respect to FIGS. 2-10. This process flow describes preferred manufacturing processes and techniques. As will be recognized by one of skill in the art, a number of variations are possible.

Figure 2:
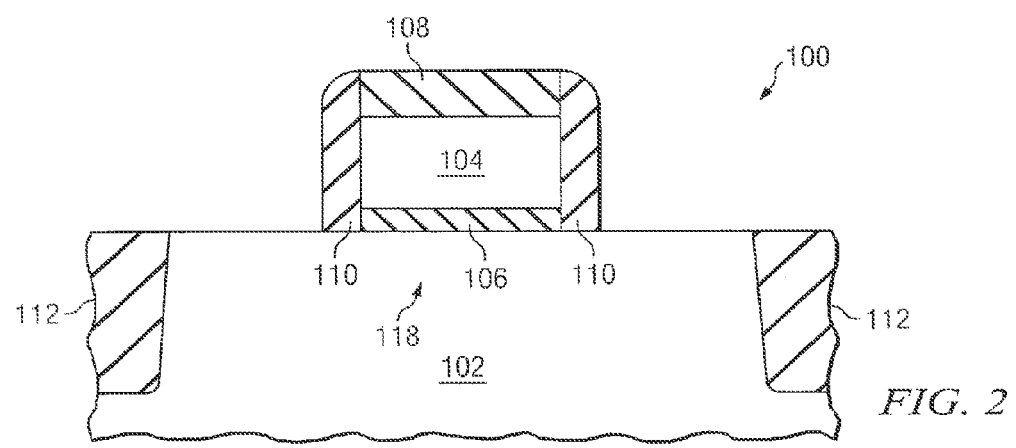
FIGS. 2-10 provide cross-sectional views illustrating a first embodiment process for producing a structure of the present invention.

Referring first to FIG. 2, a transistor has been partially fabricated. In particular, STI regions 112 and a gate stack, which includes gate dielectric 106, gate electrode 104, and hard mask layer 108, have been formed using conventional processes. Sidewall spacers 110 have also been formed along sidewalls of the gate electrode 104. These spacers can be formed by conformally depositing an insulating material and anisotropically etching the material. The thickness of the spacer can be determined by the desired dimension of the source/drain extension (or lightly doped source/drain region), which is not explicitly illustrated.

Figure 3:
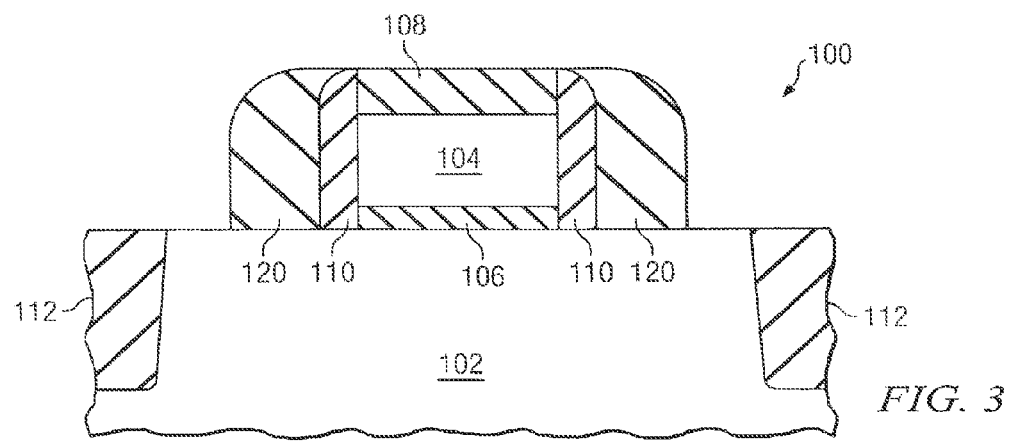

Turning now to FIG. 3, sacrificial sidewall spacers 120 are formed adjacent the sidewall spacers 110. These spacers 120 can be formed by conformally depositing the spacer material and anisotropically etching the material. The spacer material, which can be either an insulator or a conductor, is selected such that it can be selectively removed with respect to the sidewall spacer 110 and hard mask layer 108. In a preferred embodiment, the sacrificial spacer is formed using low temperature oxide (LTO) process. This thickness of the spacer is determined by the desired length of the embedded semiconductor region (116 in FIG. 1).

In one exemplary embodiment, the sacrificial spacer has a length of between about 30 nm and 100 nm along the surface of the semiconductor body 102. As a point of reference, the gate electrode 104 has a length of between about 30 nm and 100 nm. Consequently, the ratio of the sacrificial spacer length to the gate length is between about 1:2 and 2:1. As will become clear below, the length of the sacrificial spacer along the surface of the body 102 will define the length of the embedded semiconductor region 116.

Figure 4:
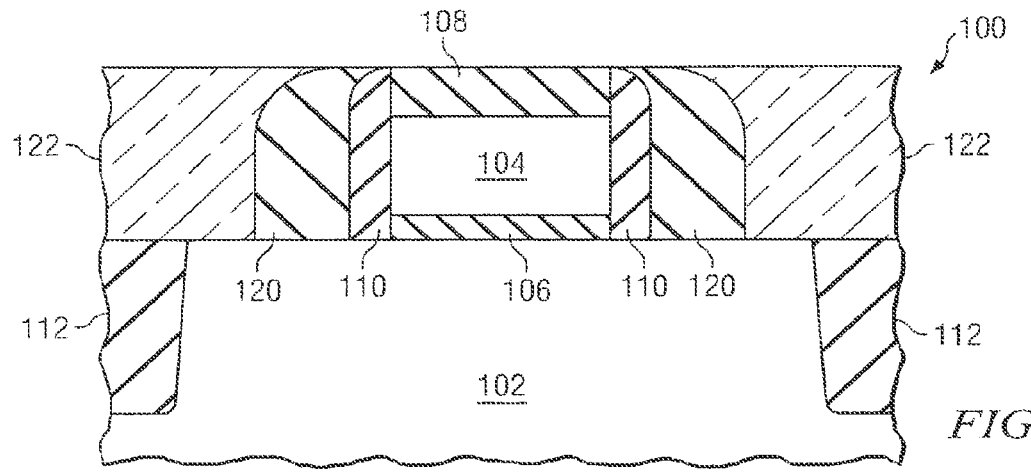

A planarization layer 122 can then be formed over the structure as shown in FIG. 4. The planarization layer material is selected such that sacrificial spacer 120 can be removed selectively with respect to the layer 122. In one embodiment, the planarization layer 122 is formed by depositing and reflowing a layer of borophosphosilicate glass (BPSG). In other embodiments, other materials can be used.

Figure 5:
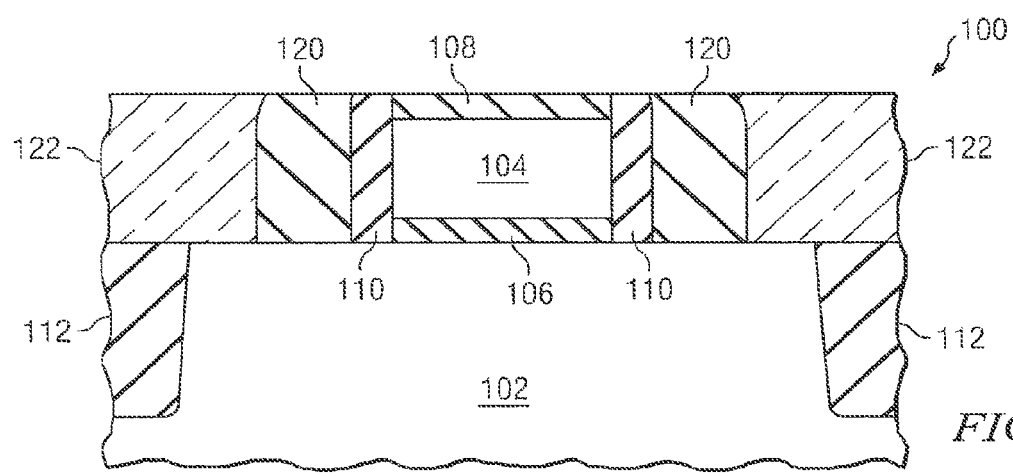

Referring next to FIG. 5, an upper surface of the wafer is removed. This process can be performed with a chemical-mechanical polish (CMP) or a reactive ion etch (RIE). In the illustrated embodiment, the resulting structure is planar. In other embodiments (see FIG. 14, for example), this result is not required. After the process, portions of the sacrificial spacer 120 will be exposed.

Figure 6:
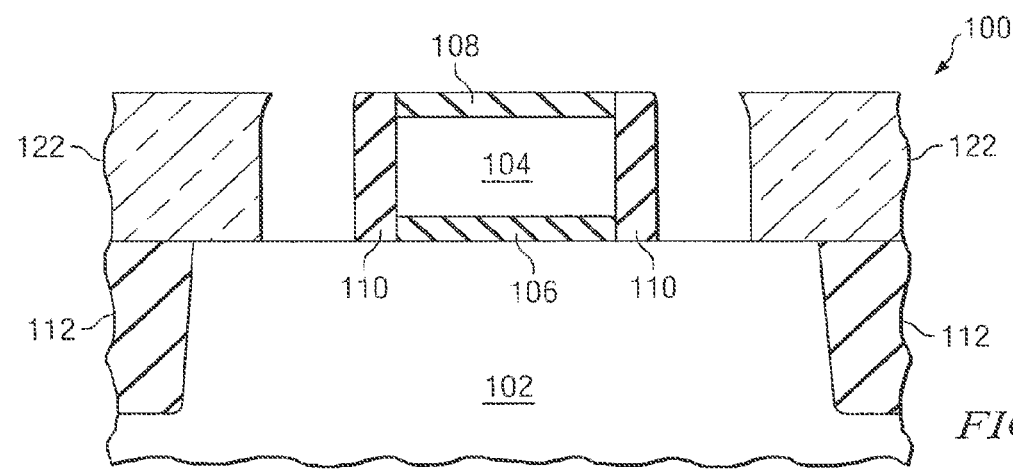

As shown in FIG. 6, the sacrificial spacer 120 is removed selective to the sidewall spacers 110 and the planarization layer 122. In the preferred embodiment, an isotropic wet etch is performed. In one specific embodiment, the sacrificial spacer 120 is made from a low temperature oxide, the sidewall spacer 110 (or at least the exposed portions of the sidewall spacer 110) is made from a nitride, and the planarization layer is made from BPSG. With these materials, the sacrificial oxide can be removed.

Figure 7:
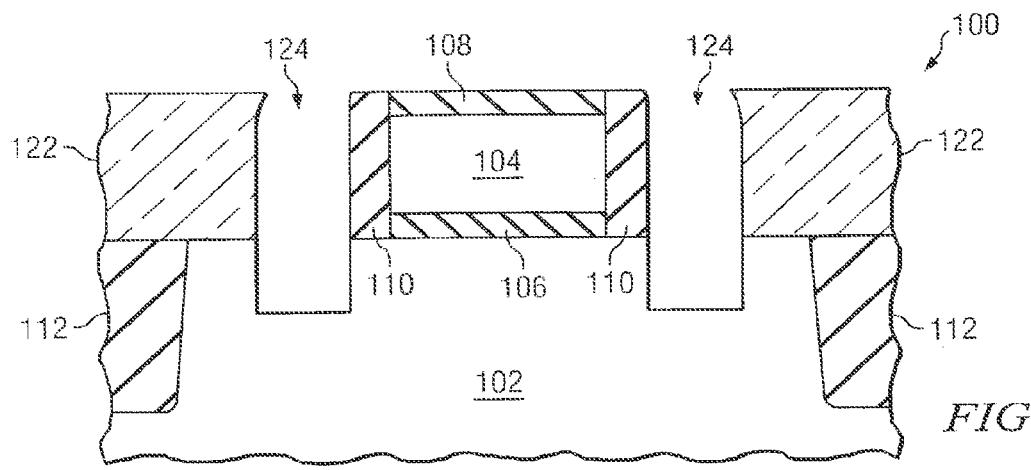

Referring next to FIG. 7, recesses 124 are etched into regions of the semiconductor body 102 that are exposed by the removal of the sacrificial spacer. In various embodiments, the recess can be etched to a depth between about 20 nm and about 150 nm. As but two examples, a recess of a depth of about 30 nm to about 45 nm can be used in an SOI embodiment and a recess of about 100 nm can be etched for a bulk embodiment. The length of the recess will correspond to the length of the sacrificial spacer 120 and the width of the recess (i.e., the distance into and out of the page in FIG. 7) will correspond to the transistor width (or active area width).

Figure 8:
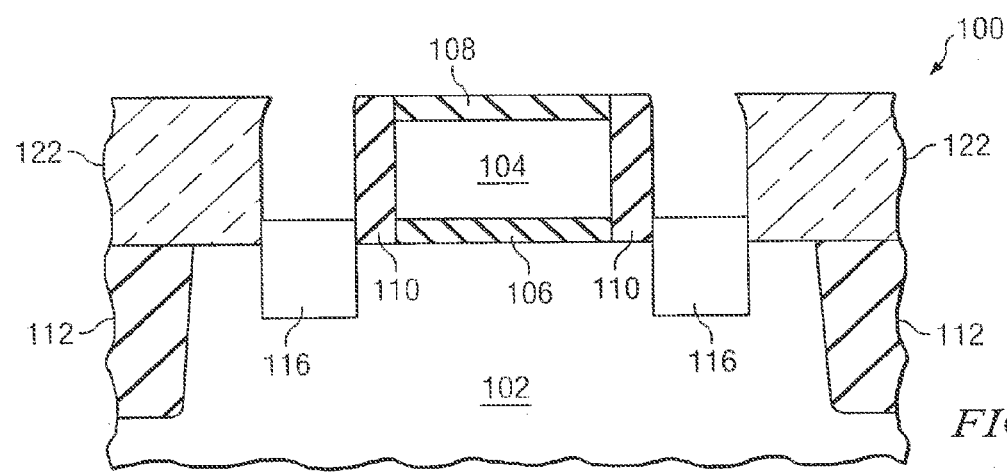

The embedded semiconductor regions 116 can then be formed as illustrated in FIG. 8. In one embodiment, SiGe or SiC is selectively deposited using an epitaxial growth process. This semiconductor can be doped in situ or deposited undoped. In one example, silicon germanium is doped in situ with boron to create a p-channel transistor. If the n-channel transistors are to include regions embedded with a different material, they can be masked (e.g., with photoresist) at this point. If the n-channel transistors include no embedded region, they would be masked during the step of forming the recess as well. In another example, silicon carbon is deposited and doped in situ with arsenic or phosphorus.

Figure 9:
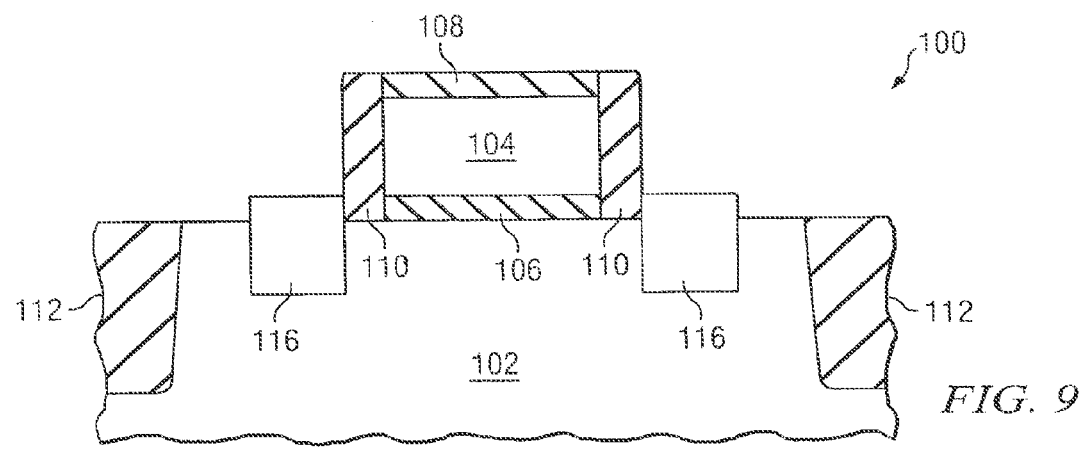
Figure 10:
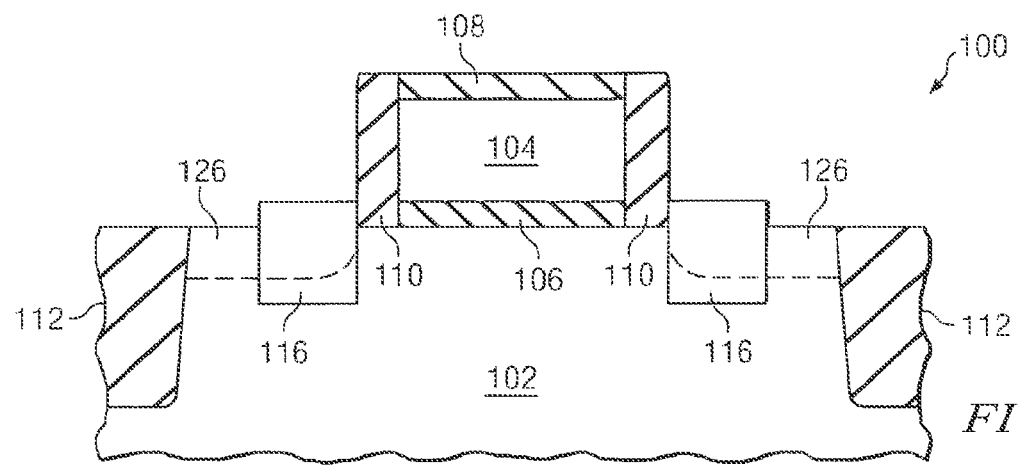

As shown in FIG. 9, the planarization layer 122 can then be removed This leads to the basic structure as discussed above with respect to FIG. 1. As an optional step, source/drain dopants 126 can be implanted, as shown in FIG. 10. For p-channel transistors, the source/drain dopants 126 can be boron and for n-channel transistors, the source/drain dopants 126 can be arsenic or phosphorus, for example.

An alternate process for fabricating a transistor is illustrated with respect to FIGS. 11-16. Due to the similarity in the two processes, many of the details will not be repeated. It is understood that either process can be varied using any of the details discussed herein.

Figure 11:
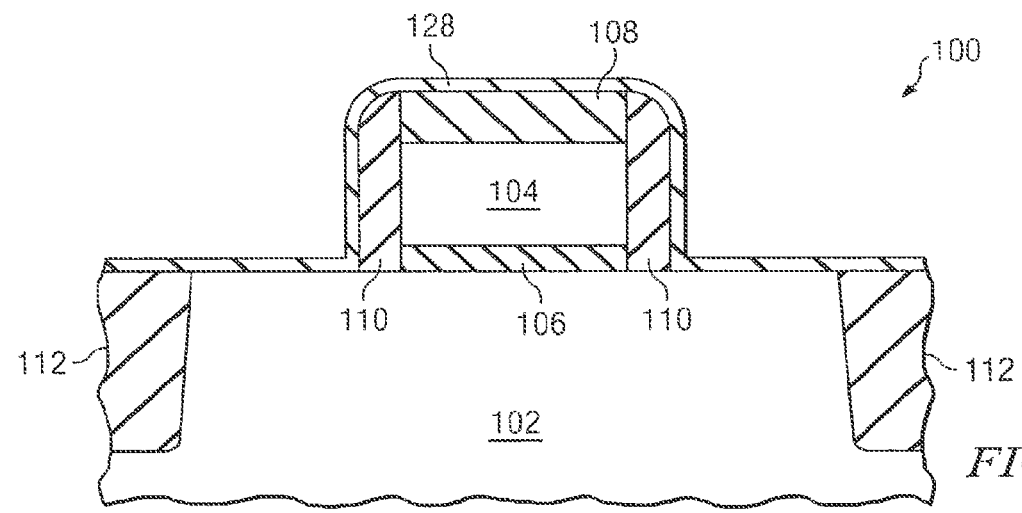
FIGS. 11-18 provide cross-sectional views illustrating a second embodiment process for producing a structure of the present invention.

FIG. 11 illustrates a structure that is similar to the structure of FIG. 2 but additionally includes a masking layer 128. Masking layer 128 can be included to protect the gate stack and sidewall spacers 110 during the removal of the sacrificial sidewall spacer 120. In one example, the masking layer 128 is a silicon nitride (e.g., $Si_3N_4$) with a thickness of about 10 to about 50 nm. By including this liner 128, the sidewall spacer 110 and the sacrificial spacer 120 can be formed from the same material.

Figure 12:
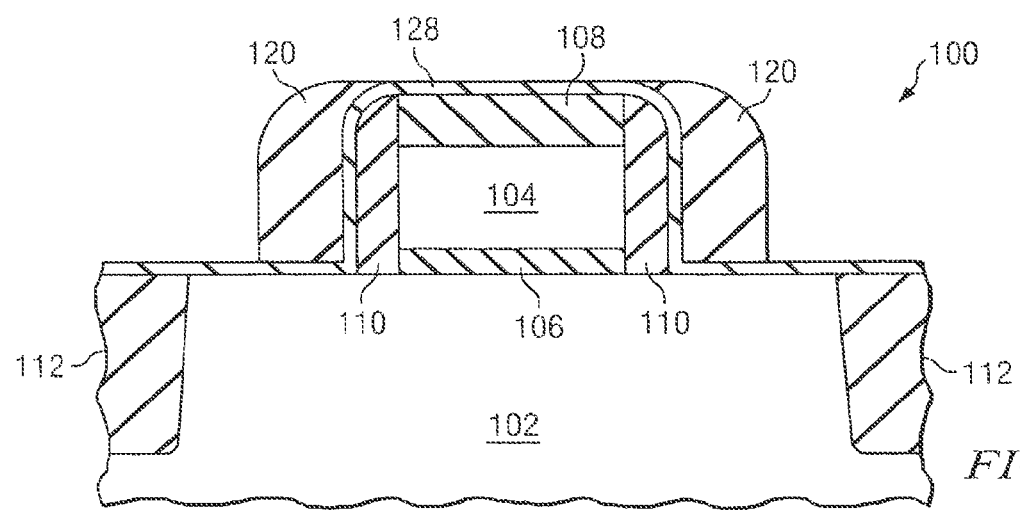
Figure 13:
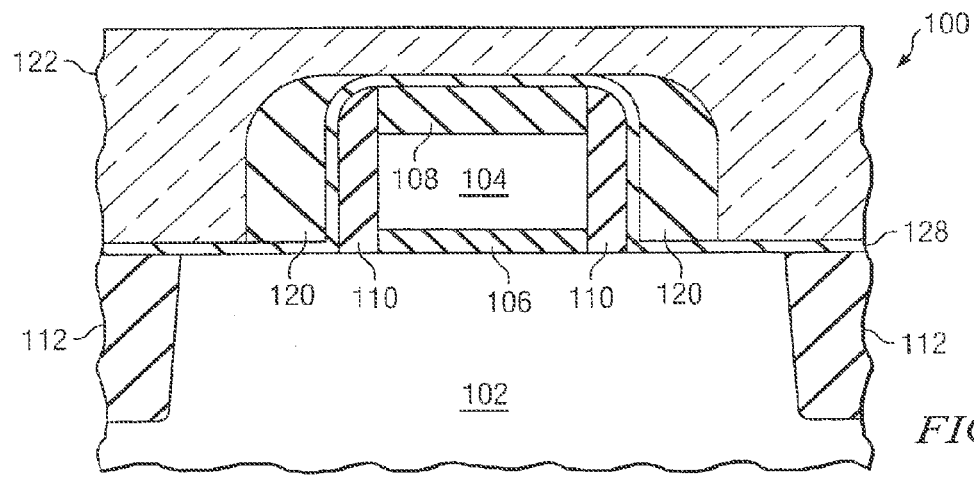

The formation of the sacrificial spacer 120 is shown in FIG. 12 and the formation of planarization layer 122 is shown in FIG. 13. As before, it is desired that the materials of sacrificial spacer 120 and planarization layer 122 be selected so that the spacer 120 can be selectively removed. In one embodiment, the planarization layer 122 is formed from a resist while the sacrificial spacer is formed from an oxide. As an example, the resist material can be spun on in a substantially planar manner. As noted above, the choice of sacrificial spacer material is independent of the material of sidewall spacer 110.

Figure 14:
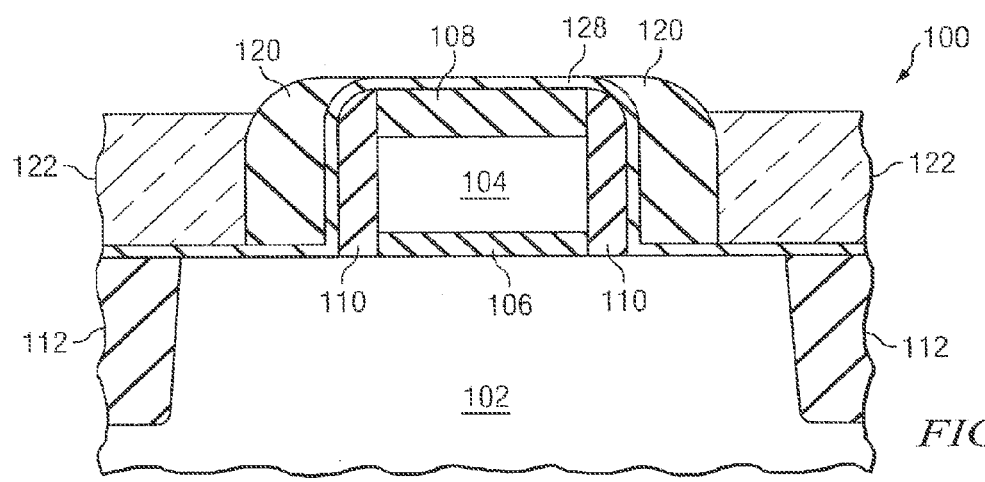

The planarization material is then etched back as shown in FIG. 14. The amount of etch back should be sufficient to expose a portion of the sacrificial spacer 120 but still leave enough material 122 to protect semiconductor body 102 during the subsequent recess etch. As an example, the thickness of the resist layer can be 500-1000 nm before the recess, and 50-100 nm after the recess.

Figure 15:
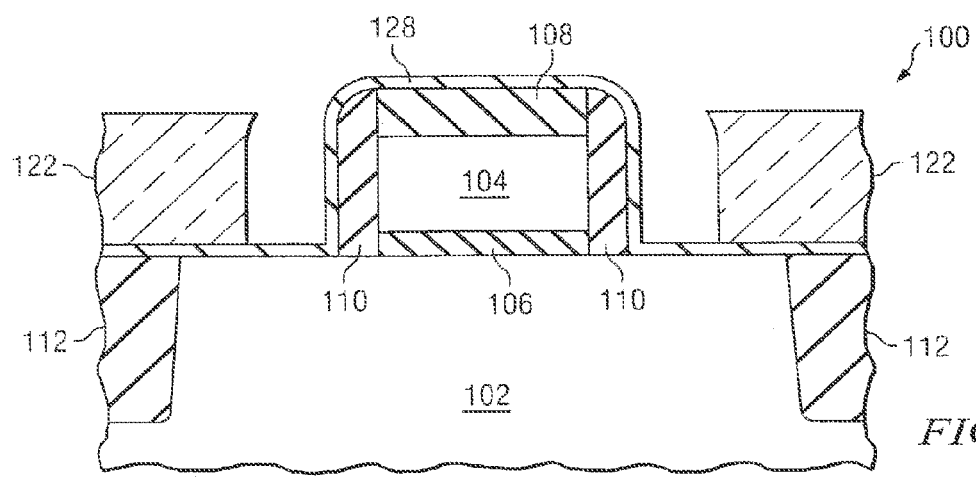

The sacrificial spacer can then be selectively removed as shown in FIG. 15. This removal can be done by wet etch using diluted or buffered HF in the case of an oxide sacrificial spacer, or alternatively by dry etching. This step will expose a portion of the masking layer 128 over the semiconductor body 102. This exposed portion of the masking layer can then be opened, for example, using an anisotropic etch process.

Figure 16:
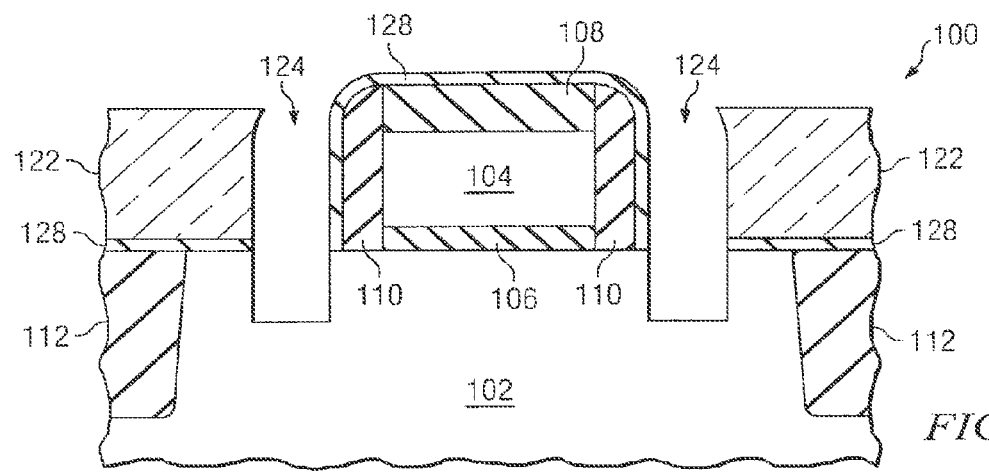
Figure 17:
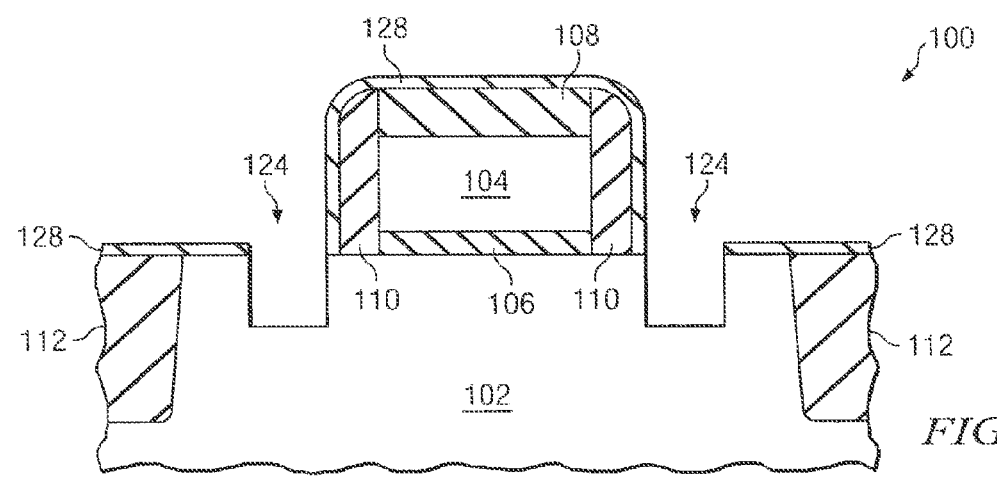
Figure 18:
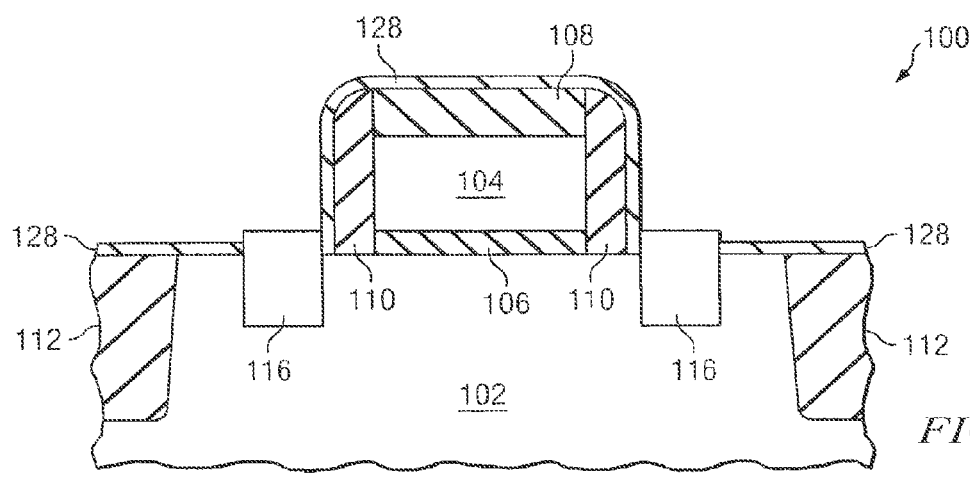

FIG. 16 illustrates the recess etch that was described earlier with respect to FIG. 7. In a next step, the resist 122 is removed as shown in FIG. 17 and the trenches are filled as described in the earlier embodiment. The selective deposition of semiconductor material 116 is illustrated in FIG. 18, where the layer 128 is used as a mask for the selective deposition. The layer 128 can then be removed or allowed to remain.

Additional processes such as interlevel dielectrics, contact plugs and metallization are not shown, but would be included.

Figure 19:
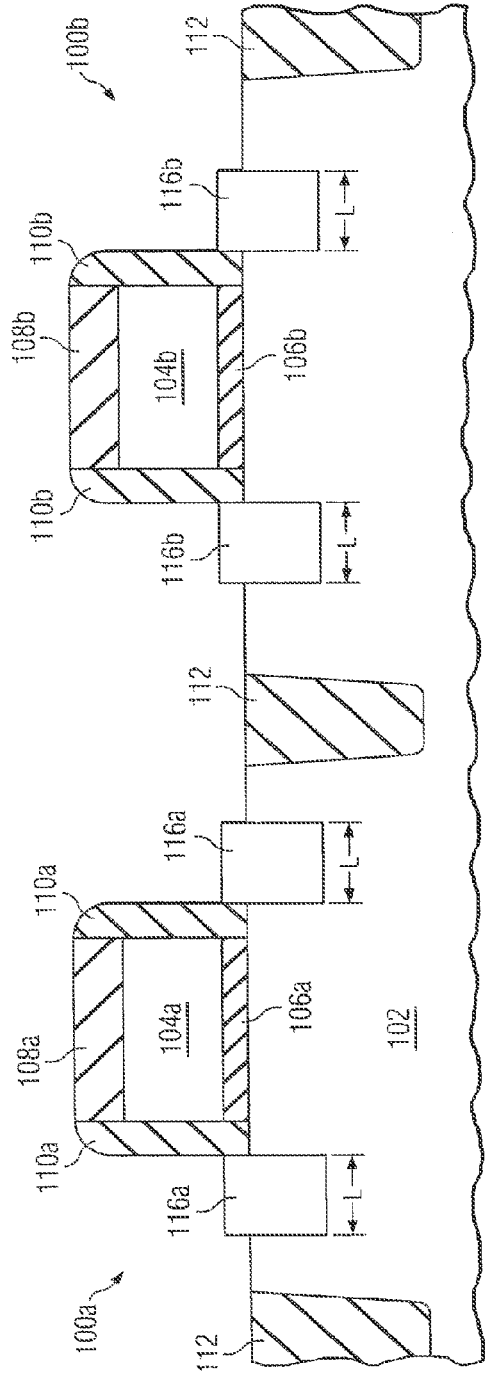
FIG. 19 is a cross-sectional view of an embodiment of the present invention.
Figure 20:
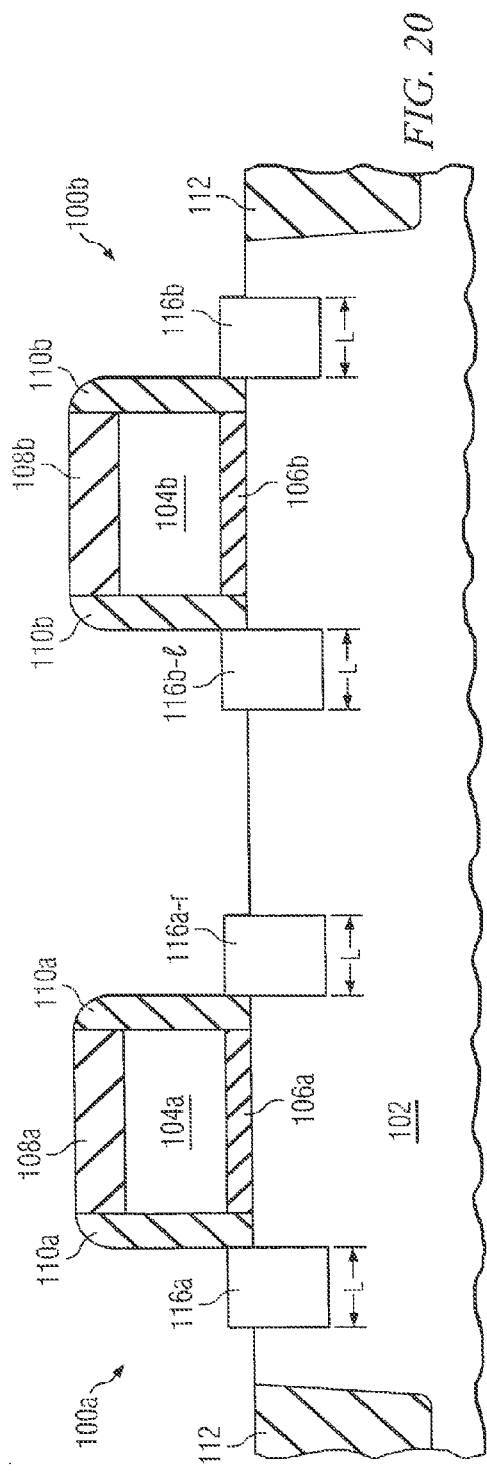
FIG. 20 is a cross-sectional view of an alternate embodiment of the present invention.

FIGS. 19 and 20 illustrate two embodiments that can utilize concepts of the present invention. In FIG. 19, two transistors 100a and 100b are shown. Both transistors are formed in the same semiconductor body 102 but have different dimensions. Shallow trench isolation regions 112 are shown but it is understood that other isolation techniques (e.g., mesa isolation for SOI devices) could be utilized. It is also understood that these two transistors are shown next to each to simplify illustration. The transistors could be spaced from one another anywhere on the die and could have source/drain current paths that are oriented at different angles from each other.

One point of interest in the structure of FIG. 19 is that both transistors 100a and 100b include embedded semiconductor regions 116 of the same length (i.e., the distance extending in parallel with the current path). The width of the embedded regions would be the same as the transistor's channel width and may vary from transistor to transistor. As shown in FIG. 19, the region 116a has a length L that is the same as the length L of the region 116b. This is true even though the distance between sidewall spacer 110a and isolation region 112 is smaller than the distance between sidewall spacer 110b and isolation region 112. Since the embedded regions 116a and 116b have similar dimensions, it is more likely that they will apply similar stresses to their associated channel regions.

FIG. 20 illustrates another embodiment where two transistors 100a and 100b are formed in a single active region. In this case, the embedded region 116a-r is spaced from the embedded region 116b-1 without any intervening isolation regions. This situation can occur, for example, when two transistors have a shared source/drain region. Despite the shared source/drain, each transistor 100a and 100b has a separate set of embedded regions 116 of the same length.

The embedded regions 116a and 116b can include the same or different semiconductor materials. For example, when transistor 100a is an n-channel transistor and transistor 100b is a p-channel transistor, the region 116a can be embedded with SiC while the region 116 is embedded with SiGe. A silicide region or other conductor (not shown) can be used to electrically couple across the common source/drain region.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a semiconductor device, the method comprising:
    forming a first gate electrode and a second gate electrode over a semiconductor body, the first and second gate electrodes being electrically insulated from the semiconductor body;
    forming a first sidewall spacer along a first sidewall of the first gate electrode and a second sidewall spacer along a second sidewall of the second gate electrode;
    forming first and second sacrificial sidewall spacers, the first sacrificial sidewall spacer adjacent the first sidewall spacer, and the second sacrificial sidewall spacer adjacent the second sidewall spacer;
    forming a planarization layer between the first and second sacrificial sidewall spacers;
    removing the first and second sacrificial sidewall spacers thereby exposing a first region and a second region of the semiconductor body;
    etching the first region and the second region thereby forming first and second recesses in the semiconductor body;
    forming a first semiconductor material in the first recess; and
    forming a second semiconductor material in the second recess, wherein there is no isolation region between the first recess and the second recess.

2. The method of claim 1, wherein the first semiconductor material is the same as the second semiconductor material.

3. The method of claim 1, wherein forming the first semiconductor material in the first recess comprises depositing the first semiconductor material in the first recess, and wherein forming the second semiconductor material in the second recess comprises depositing the second semiconductor material in the second recess.

4. The method of claim 1, wherein the first and second electrodes have substantially the same gate length.

5. A method of fabricating a semiconductor device, the method comprising:

forming a first gate electrode and an adjacent second gate electrode over a semiconductor body, the first and second gate electrodes being electrically insulated from the semiconductor body;

forming a first sidewall spacer along a first sidewall of the first gate electrode;

forming a second sidewall spacer along a second sidewall of the second gate electrode;

forming a masking layer over the semiconductor body including over the first and second gate electrodes and the first and second sidewall spacers;

forming first and second sacrificial sidewall spacers over the masking layer adjacent the first and second sidewall spacers, the first and second sacrificial sidewall spacers and the first and second sidewall spacers overlying the semiconductor body;

forming a planarization layer between the first and second sacrificial sidewall spacers;

removing the first and second sacrificial sidewall spacers;

etching first and second recesses in the semiconductor body, wherein the first and second recesses are separated by a region of the semiconductor body, and wherein the first and second recesses have substantially the same dimension;

removing the planarization layer; and forming a first semiconductor material in the first recess and second semiconductor material in the second recess using the masking layer as a deposition mask.

6. The method of claim 5, wherein the first semiconductor material is the same as the second semiconductor material.

7. The method of claim 5, wherein the first and second gate electrodes have substantially the same gate length.

8. A method of forming a semiconductor device, the method comprising:

providing a semiconductor body formed from a first semiconductor material;

forming a first gate electrode over an upper surface of the semiconductor body;

forming a first sidewall spacer along a first sidewall of the first gate electrode;

forming an opening in the semiconductor body by selectively removing a sacrificial sidewall spacer formed over the first sidewall spacer and exposing an underlying portion of the semiconductor body;

embedding a first region of a second semiconductor material within the opening in the semiconductor body, the first region of the second semiconductor material being adjacent the first sidewall spacer and laterally spaced from an isolation region by a first distance;

forming a second gate electrode over the upper surface of the semiconductor body;

forming a second sidewall spacer along a second sidewall of the second gate electrode; and embedding a second region of a third semiconductor material within the semiconductor body, wherein the second region of the third semiconductor material is adjacent the second sidewall spacer and laterally spaced from the isolation region by a second distance, and wherein the first distance and the second distance are different.

9. The method of claim 8, wherein the semiconductor body comprises a semiconductor layer on an SOI substrate.

10. The method of claim 8, wherein the second semiconductor material and the third semiconductor material comprise a same material.

11. The method of claim 10, wherein the first semiconductor material comprises silicon and the second semiconductor material comprises silicon germanium.

12. The method of claim 10, wherein the first semiconductor material comprises silicon and the second semiconductor material comprises silicon carbon.

13. The method of claim 8, wherein the first region is disposed within a first recess in the semiconductor body, and wherein the second region is disposed within a second recess in the semiconductor body.

14. The method of claim 13, wherein the first recess is substantially aligned with the first sidewall spacer, and wherein the second recess is substantially aligned with the second sidewall spacer.

15. The method of claim 8, wherein the isolation region comprises a shallow trench isolation region.

16. The method of claim 8, wherein the first gate electrode has a first gate length and wherein the second gate electrode has a second gate length, and wherein the first gate length and the second gate length are different.

17. The method of claim 8, wherein the first gate electrode is insulated from the semiconductor body by a first gate dielectric and the second gate electrode is insulated from the semiconductor body by a second gate dielectric, and wherein the first and second gate gate dielectrics comprise silicon oxynitride (SiON), oxide-nitride-oxide (ONO), silicon nitride, $HfO_2$, (nitrided) HF silicate, $Al_2O_3$, $ZrO_2$, Zr—Al—P, or Zr silicate.

* * * * *